(12) United States Patent
Funnemann

(10) Patent No.: US 8,530,835 B2
(45) Date of Patent: Sep. 10, 2013

(54) IMAGING ENERGY FILTER FOR ELECTRICALLY CHARGED PARTICLES AND SPECTROSCOPE HAVING SAME

(76) Inventor: Dietmar Funnemann, Berlin (DE)

( * ) Notice: Subject to any disclaimer, the term of this patent is extended or adjusted under 35 U.S.C. 154(b) by 21 days.

(21) Appl. No.: 13/389,923

(22) PCT Filed: Aug. 31, 2010

(86) PCT No.: PCT/EP2010/062724
§ 371 (c)(1),
(2), (4) Date: Mar. 23, 2012

(87) PCT Pub. No.: WO2011/036038
PCT Pub. Date: Mar. 31, 2011

(65) Prior Publication Data
US 2012/0261571 A1 Oct. 18, 2012

(30) Foreign Application Priority Data
Sep. 24, 2009 (DE) .................. 10 2009 044 989

(51) Int. Cl.
*H01J 49/00* (2006.01)
(52) U.S. Cl.
USPC ............... 250/305; 250/396 R; 250/396 ML; 250/397; 250/398
(58) Field of Classification Search
None
See application file for complete search history.

(56) References Cited

U.S. PATENT DOCUMENTS

| 3,585,383 | A | * | 6/1971 | Castaing et al. | ............... 850/1 |
| 3,766,381 | A | * | 10/1973 | Watson | ............... 250/283 |
| 6,104,029 | A | * | 8/2000 | Coxon et al. | ............... 250/305 |
| 6,501,076 | B1 | | 12/2002 | Kelly et al. | |
| 2006/0016974 | A1 | * | 1/2006 | Funnemann et al. | ......... 250/281 |
| 2007/0200062 | A1 | | 8/2007 | Tromp | |

FOREIGN PATENT DOCUMENTS

| DE | 1 498 646 | | 12/1968 |
| DE | 102 52 129 | | 5/2004 |
| DE | 10252129 A1 | * | 5/2004 |
| EP | 1 559 126 B1 | | 8/2005 |
| RU | 2 364 004 C1 | | 8/2009 |
| WO | WO 2004042770 A2 | * | 5/2004 |

OTHER PUBLICATIONS

International Preliminary Report on Patentability for International application No. PCT/EP2010/062724, dated Apr. 12, 2012.

(Continued)

*Primary Examiner* — Andrew Smyth
(74) *Attorney, Agent, or Firm* — Morgan, Lewis & Bockius LLP

(57) ABSTRACT

The present invention concerns an imaging energy filter for electrically charged particles with a toroidal energy analyzer, preferably with a hemispherical analyzer, with an entrance plane and an exit plane. To provide an imaging energy filter and a spectroscope having such an imaging energy filter, which has a higher degree of position and angle resolution and which can be operated with a greater acceptance angle, it is proposed according to the invention that a mirror element for electrically charged particles is provided and is so arranged that charged particles which leave the toroidal energy analyzer by way of the exit plane are reflected back into the toroidal energy analyzer by the mirror element so that the charged particles pass through the toroidal energy analyzer a further time in the opposite travel direction.

22 Claims, 3 Drawing Sheets

(56) References Cited

OTHER PUBLICATIONS

Escher et al., "NanoESCA: a novel energy filter for imaging x-ray photoemission spectroscopy; NanoESCA: a novel energy filter for imaging XPS", Journal of Physics: Condensed Matter, Institure of Physics Publishing, Bristol, GB, vol. 17, No. 16, pp. S1329-S1338, Apr. 27, 2005.

International Search Report of PCT/EP2010/062724.

German Search Report of Application 10 2009 044 989.2.

* cited by examiner

IMAGING ENERGY FILTER FOR ELECTRICALLY CHARGED PARTICLES AND SPECTROSCOPE HAVING SAME

RELATED APPLICATIONS

The present application is a U.S. National Phase Application of International Application No. PCT/EP2010/062724, filed Aug. 31, 2010, which claims priority to German Application No. 10 2009 044 989.2, filed Sep. 24, 2009.

The present invention concerns an imaging energy filter for electrically charged particles and a spectroscope having such an energy filter.

Energy filters are used to determine the energy of charged particles such as for example electrons.

To analyse materials the electrons of the material to be investigated are excited in electron spectroscopy. That can be effected for example by means of electrons which are radiated thereinto but also by X-ray radiation or UV radiation.

The kinetic energy of the electrons is then measured. An electron spectrometer is used for that purpose, by means of which it is possible to determine the number of excited electrons with a given kinetic energy.

Imaging energy filters for electrically charged particles are known for example from EP 1 559 126.

That energy filter is constructed on a hemispherical analyser. A hemispherical analyser comprises two metallic hemispheres. One is shaped concavely while the other is of a convex configuration. The center points of curvature of the two hemispheres coincide. Different voltages are applied to the hemispheres so that an electric field is produced between the two hemispheres. Electrons which are to be energy-filtered can now be injected by way of an entrance surface into the gap between the two hemispheres. Electrons with a kinetic energy which is in a narrow energy range (also named the pass energy) can pass completely through the analyser and reach a detector arranged behind an exit surface. Electrons with excessively high energy will impact on the outer hemisphere while electrons with excessively low energy will impact on the inner hemisphere.

The hemispherical analyser is focusing, that is to say electrons with the same energy are focused almost on to the same point at an exit aperture in a first approximation independently of their exact angle of entry into the hemispherical analyser. Therefore electrons of a given energy can be detected at the output of the hemispherical analyser. The pass energy can be adjusted by changing the electric field between the inner and outer hemispheres.

The hemispherical analyser operates as an energy filter, that is to say the energy of the charged particles can be determined. The excited electrons are generally incident on the entrance surface of the hemispherical analyser at different angles and/or at different locations.

The position and angle distributions in principle allow conclusions to be drawn about the origin of the charged particles.

If for example a sample is irradiated with a suitable radiation source such as for example an electron source then electrons can be detached from the sample surface or the electrons of the electron source can be diffracted at the surface.

If the sample surface is imaged on to the entrance surface of the hemispherical analyser then the position distribution of the electrons includes information about the structure of the sample at the surface. The angle distribution allows conclusions to be drawn about the geometrical arrangement of the atoms.

The position and angle distribution however is lost due to the focusing property of the hemispherical analyser if the exit surface is imaged directly on to the detector.

Therefore EP 1 559 126 has already proposed using two hemispherical analysers which are connected one behind the other. In that case the first hemispherical analyser serves to pass on only charged particles with a pass energy while the second hemispherical analyser restores the position and angle distribution of the charged particles.

To image the charged particles which issue from the first hemispherical analyser on to the input of the downstream-disposed hemispherical analyser, transfer lenses, that is to say lenses for charged particles, are employed. That measure affords an imaging energy filter as the second hemispherical analyser corrects the image errors of the first.

It is known however that chromatic aberration (color error) and spherical aberration (aperture error) basically do not disappear in optically imaging systems for charged particles when using static, space charge-free and rotationally symmetrical tubular lenses. Those errors inherent in the transfer lenses limit the operational efficiency of the system and lead to the known system having only a low acceptance angle as the imaging quality of electrons incident on the entrance surface with a greater angle of incidence is too poor.

In consideration of the described state of the art therefore the object of the present invention is to provide an imaging energy filter or a spectroscope with such an imaging energy filter, which has a higher level of position and angle resolution and which can be operated with a greater acceptance angle.

According to the invention that object is attained by an imaging energy filter for electrically charged particles with a toroidal energy analyser, preferably with a hemispherical analyser, with an entrance plane and an exit plane, wherein a mirror element is provided for electrically charged particles and is so arranged that charged particles which leave the toroidal energy analyser by way of the exit plane are reflected back into the toroidal energy analyser by the mirror element so that the charged particles pass through the toroidal energy analyser a further time in the opposite travel direction.

The expression 'in the opposite travel direction' does not mean that the charged particles follow exactly the same path but pass through the energy analyser from the exit surface to the entrance surface. In a preferred embodiment the charged particles are incident on the entrance surface at a first angle and leave it at a second angle after they have passed through the energy analyser twice, wherein the first and second angles are oppositely equal, that is to say the incident beam, the axis of incidence and the issuing beam are in one plane and the angles of incidence and exit are the same.

As already described in EP 1 559 126 it is not absolutely necessary to use a hemispherical analyser. In principle any toroidal energy analyser is suitable such as for example also a cylindrical analyser or a spherical sector analyser. Corresponding examples are described in EP 1 559 126.

Even if hereinafter the present invention is described in relation to the example of the particularly preferred hemispherical analyser it will be appreciated that instead it would also be possible to use any other toroidal energy analyser.

The arrangement according to the invention of a suitable reflection mirror for charged particles firstly provides that it is possible to dispense with the second toroidal energy analyser. Instead the charged particles are reflected back into the first toroidal energy analyser by the mirror.

In principle it is possible for the reflection mirror to be positioned directly in the exit plane of the toroidal analyser. Reflection mirrors for charged particles however generally have a fixed negative spherical and chromatic aberration which is not to be disregarded.

Therefore a preferred embodiment provides that a transfer lens device is arranged between the exit plane and the mirror element. The transfer lens device and the mirror element can then be so arranged that the aberrations of the transfer lens device are reduced by the mirror element.

In that respect the transfer lens device is designed in such a way that it images the intermediate image $ZB_1$ in the exit plane of the energy analyser on to the mirror element as an intermediate image of the magnitude $ZB_2$ with a linear magnification $V_L = ZB_2/ZB_1 < 0$.

In principle the transfer lens device can be designed precisely as is described in EP 1 559 126.

In a particularly preferred embodiment the linear magnification $V_L = -1$. It is further desirable if the angle magnification $V_W$ is negative and at best $V_W = -1$.

In a preferred embodiment the transfer lens device has at least two lenses for electrically charged particles.

The mirror element can be an electrostatic mirror. In principle however any mirror by which the charged particles can be reflected is suitable. Advantageously the mirror element and the transfer lens device are so matched to each other that the chromatic aberration and/or the spherical aberration of the transfer lens device is reduced by the mirror element and more specifically preferably by at least 30% and particularly preferably by at least 60% and best by at least 75%. Therefore the quality demands on the transfer lens device can be reduced by the arrangement according to the invention of the mirror element without the degree of resolution being considerably worsened. It is basically easier and thus also considerably less expensive for the imaging errors of the transfer lens device to be corrected by adaptation of the mirror element than to improve the transfer lens device at a high level of complication and expenditure, especially as the imaging error of the transfer lens device cannot be completely reduced by virtue of theoretical considerations.

The combination of mirror element and transfer lens device is therefore capable of reducing the imaging errors which are basically involved, when using a transfer lens device, and in the ideal case even compensating for same.

In addition any further image errors which may be present and which arise in imaging or transfer systems outside the energy analyser can be reduced by the combination of transfer lens device and mirror element whose optical properties can be easily influenced and therefore adapted. If for example the charged particles are imaged with a lens on to the entrance surface of the energy analyser that lens will cause an imaging error which can also be reduced or even completely compensated in a calibration operation by means of the transfer lens device and/or the mirror element.

As according to the invention the charged particles enter by way of the entrance plane of the toroidal energy analyser and also issue again after reflection, in a preferred embodiment there is provided a separating element for charged particles. The incident particles can be separated from the issuing particles by means of that separating element.

In a particularly preferred embodiment the separating element is embodied by a magnetic diverter having an entrance surface for charged particles, an energy filter surface and an exit surface for energy-filtered charged particles. The magnetic diverter is so arranged that charged particles which are incident on the entrance surface of the magnetic diverter at an angle of incidence $\alpha$ which is preferably less than 20° are diverted by the magnetic diverter so that they issue from the energy filter surface of the magnetic diverter at an exit angle $\beta$ which is preferably less than 20° and are incident on the entrance surface of the toroidal energy analyser at an entrance angle $\gamma$ which is preferably less than 20° and charged particles which issue from the entrance surface of the toroidal analyser at an exit angle $\delta$ are incident on the energy filter surface of the magnetic diverter at an entrance angle $\epsilon$ which is preferably less than 20° and are diverted by the magnetic diverter so that they leave the exit surface of the magnetic diverter at an exit angle $\zeta$ which is preferably less than 20°, wherein preferably one or more lenses are provided between the magnetic diverter and the toroidal analyser.

In other words the magnetic diverter is used to separate the beam entering the energy analyser from the beam exiting the energy analyser. Magnetic diverters are known in the state of the art.

The term energy filter surface was adopted to identify the surface of the magnetic diverter, that is towards the energy filter, that is to say the surface from which the unfiltered charged particles issue and enter again after energy filtering. The surface itself therefore does not have to have any energy-filtering properties, even if that may be the case in especial embodiments. As the radius of curvature of the charged particles depends on the speed and thus the energy in a magnetic diverter it would be possible to provide the energy filter surface itself with an energy-filtering property by the arrangement of aperture plates on the energy filter surface.

The imaging energy analyser according to the invention can be used in principle in any spectroscope for charged particles. Preferably the energy analyser is used in an electron spectroscope in which the charged particles to be investigated are electrons.

In a preferred embodiment the spectroscope has a detector for detecting the charged particles issuing by way of the entrance surface of the toroidal analyser, the detector preferably being a CCD detector. The positional information which the energy-filtered electrons possess can be detected by means of the CCD detector. In that respect the detector is preferably so arranged that it detects the charged particles issuing by way of the exit surface of the magnetic diverter. In a particular embodiment at least one four-channel plate which is arranged in front of a fluorescent screen can be used so that the CCD detector is part of a camera and the intensity distribution occurring on the screen is imaged on to the CCD detector by means of an optical light system.

In addition the spectroscope advantageously has a sample receiving means so arranged that charged particles emitted by a sample arranged on the sample receiving means, possibly after passing through an optical imaging system at an angle of incidence $\gamma$ which is preferably less than 20° are incident on the entrance surface of the toroidal energy analyser or, if an energy filter with magnetic diverter is used, they are incident on the entrance surface of the magnetic diverter at an angle of incidence $\alpha$ which is preferably less than 20°.

In addition there can be provided a radiation source, preferably an electron source, an X-ray source or an ultraviolet light source for acting with radiation on a sample received on the sample receiving means. In that arrangement the magnetic diverter can have a radiation entrance surface and the radiation source can be so arranged that radiation is incident on the radiation entrance surface at an entrance angle $\beta$ which is preferably less than 10° and is diverted by the magnetic diverter in such a way that it issues from the entrance surface of the magnetic diverter at an exit angle $\theta$ which is preferably less than 10° and is directed on to the sample receiving means. In other words the magnetic diverter performs a dual function. On the one hand it provides that the charged particles passing into the energy analyser are separated from those issuing from the energy analyser. On the other hand the magnetic diverter can be used to separate the electrons originating from the electron gun (primary electrons) from those excited electrons originating from the sample.

In a further preferred embodiment the dispersive plane of the toroidal analyser is arranged substantially perpendicularly to a notional line extending between the sample receiving means and the detector. That has the advantage that the transfer lens device and the mirror element are clearly spatially separated from the detector device so that there is a greater degree of freedom in regard to the arrangement and dimensioning of the individual elements.

In a preferred embodiment the spectroscope is an imaging ESCA electron spectroscope ('electron spectroscopy for chemical analysis'). Alternatively however the energy filter according to the invention could also be an imaging Auger electron spectroscope, an LEEM ('low energy electron microscope') or a secondary ion microscope.

In a further preferred embodiment the angle distribution of the charged particles occurring in the sample, generally electrons, is imaged on to the detector in energy-filtered fashion. Here the spectroscope can be in the form of an LEED ('low energy electron diffraction') or an XPD ('X-ray photoelectron diffraction').

In addition it is possible to use the energy filter according to the invention in time-resolved measurements.

Further advantages, features and possible uses will be clearly apparent from the following description of a preferred embodiment and the related Figures in which.

Figure 1:
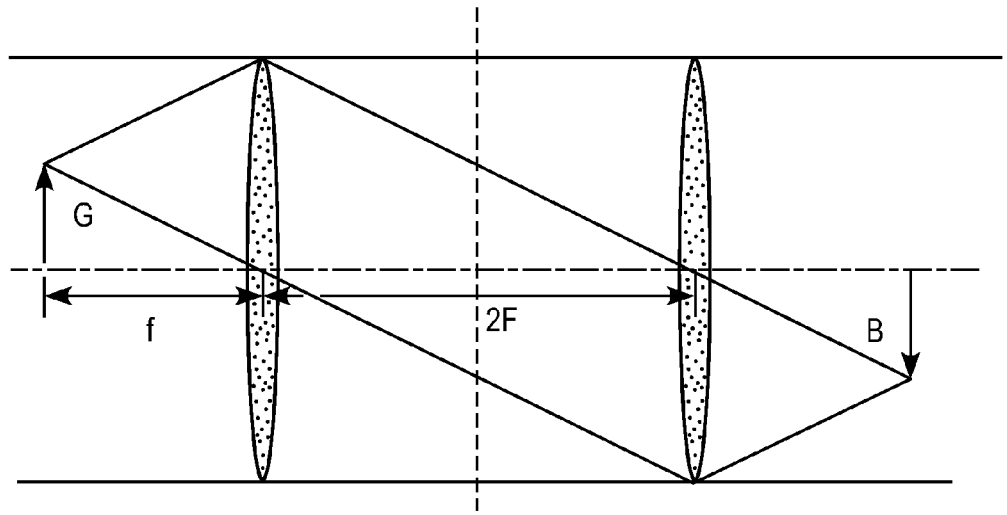
FIG. 1 shows a diagrammatic view of a transfer lens device.

FIG. 1 shows a diagrammatic view of a transfer lens device as is known in the state of the art. The transfer lens device comprises a duplet f-2α-f arrangement. With that arrangement the exit plane or the exit gap of the magnitude G can be imaged in the form of a negative image of the magnitude B. Such a transfer lens is used for example between two hemispherical analysers as described in EP 1 559 126. The transfer lens system has image errors, in particular spherical and chromatic aberration. Those image errors cannot be completely avoided here in principle in accordance with Scherzer's theorum.

The image errors act on the imaging quality and the achievable transmission of a spectroscope. In addition the image errors of such transfer lenses contribute to the final image to a greater extent than is the case with other lens systems as the transfer lens device does not magnify. As the size of the image errors becomes correspondingly greater, the greater the spatial angle employed, the acceptance angle and therewith the transmitted intensity must be limited in the known spectroscopes.

Figure 2:
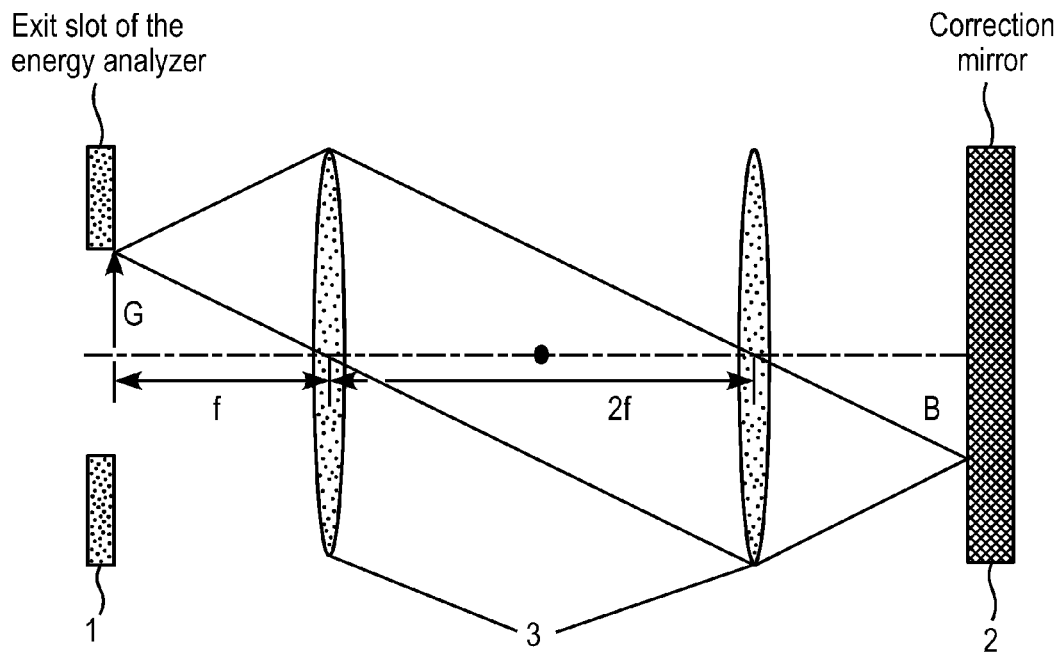
FIG. 2 shows a diagrammatic view of a combination of transfer lens device and mirror element.

According to the invention therefore a mirror element is used, which reflects the charged particles, for example the electrons, and sends them back through the toroidal energy analyser. An embodiment of the arrangement according to the invention is shown in FIG. 2. In this respect a preferred embodiment provides that the mirror element 2 is slightly curved to correct the aberrations of the lens duplet of the transfer lens device 3.

In principle it would be possible for the reflection mirror 2 also to be positioned directly at the exit of the energy analyser. It will be noted however that most reflection elements for charged particles themselves have a fixed, negative spherical and chromatic aberration. However an ideal mirror without aberration is desired at that location. A mirror with adjustable negative aberration can also be desirable as in that way it may be possible to reduce aberrations which are present at another location.

Therefore the arrangement shown in FIG. 2 is desirably employed.

Figure 3:
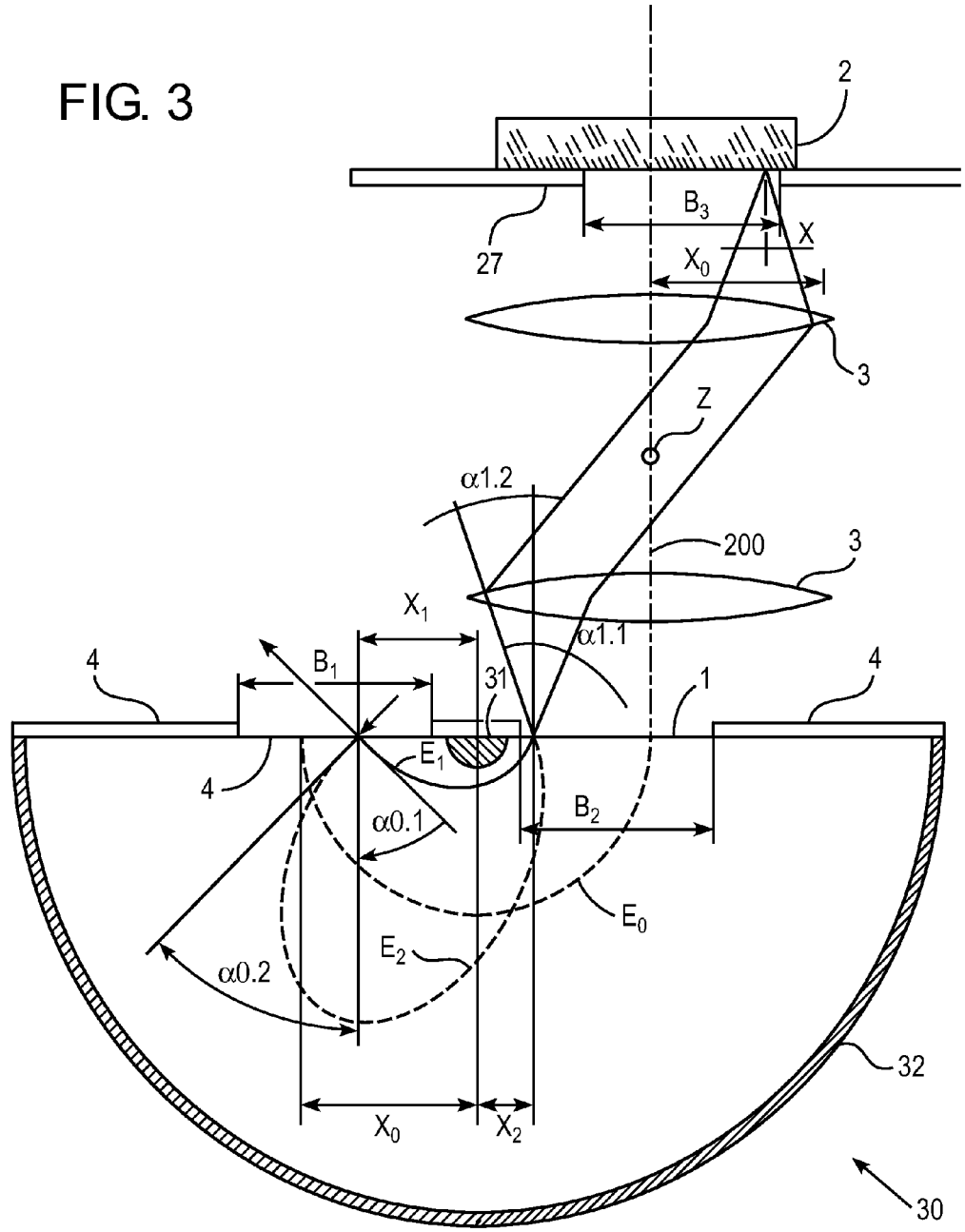
FIG. 3 shows a diagrammatic view of a hemispherical analyser with mirror element.

FIG. 3 shows a hemispherical analyser 30 with transfer lens 3 and reflection mirror 2. The hemispherical analyser 30 has an entrance surface 4 and an exit surface 1. Electrons which pass into the entrance surface 4 of the analyser are diverted by virtue of the potential difference between an inner hemisphere 31 and an outer hemisphere 32. By adjusting the potential difference it is possible to establish what energy those electrons have, which reach the exit surface 1 of the energy analyser. Because of the focusing property of the hemispherical analyser all electrons with the same energy, which are incident with different angles of incidence on the entrance surface 4 of the hemispherical analyser are deflected on the same point of the exit surface 1. Therefore electrons with a given energy can be counted by means of the hemispherical analyser. A given number of electrons can be associated with each energy value by changing the potential difference.

It will be noted in this respect that the position and angle information, that is to say the information about the angle of incidence in the entrance surface of the hemispherical analyser and the position information is lost, from which however it is possible to draw conclusions about the position of origin of the charged particles. Therefore the electrons issuing from the exit plane 1 of the energy analyser are imaged by means of the transfer lens device 3 on the mirror element 2 and are reflected there so that the reflected electrons are imaged by the transfer lens device 3 on the exit plane 1 of the energy analyser. The electrons then pass through the energy analyser in the reverse direction so that they issue in the direction of the arrow from the entrance plane 4 from the energy analyser. The energy analyser is thus transited twice. The issuing electrons are then separated from the incoming ones by a magnetic field as further described hereinafter.

The image errors of the transfer lens device 3 can be markedly reduced by the use of the mirror element 2 serving as a correction mirror.

Figure 4:
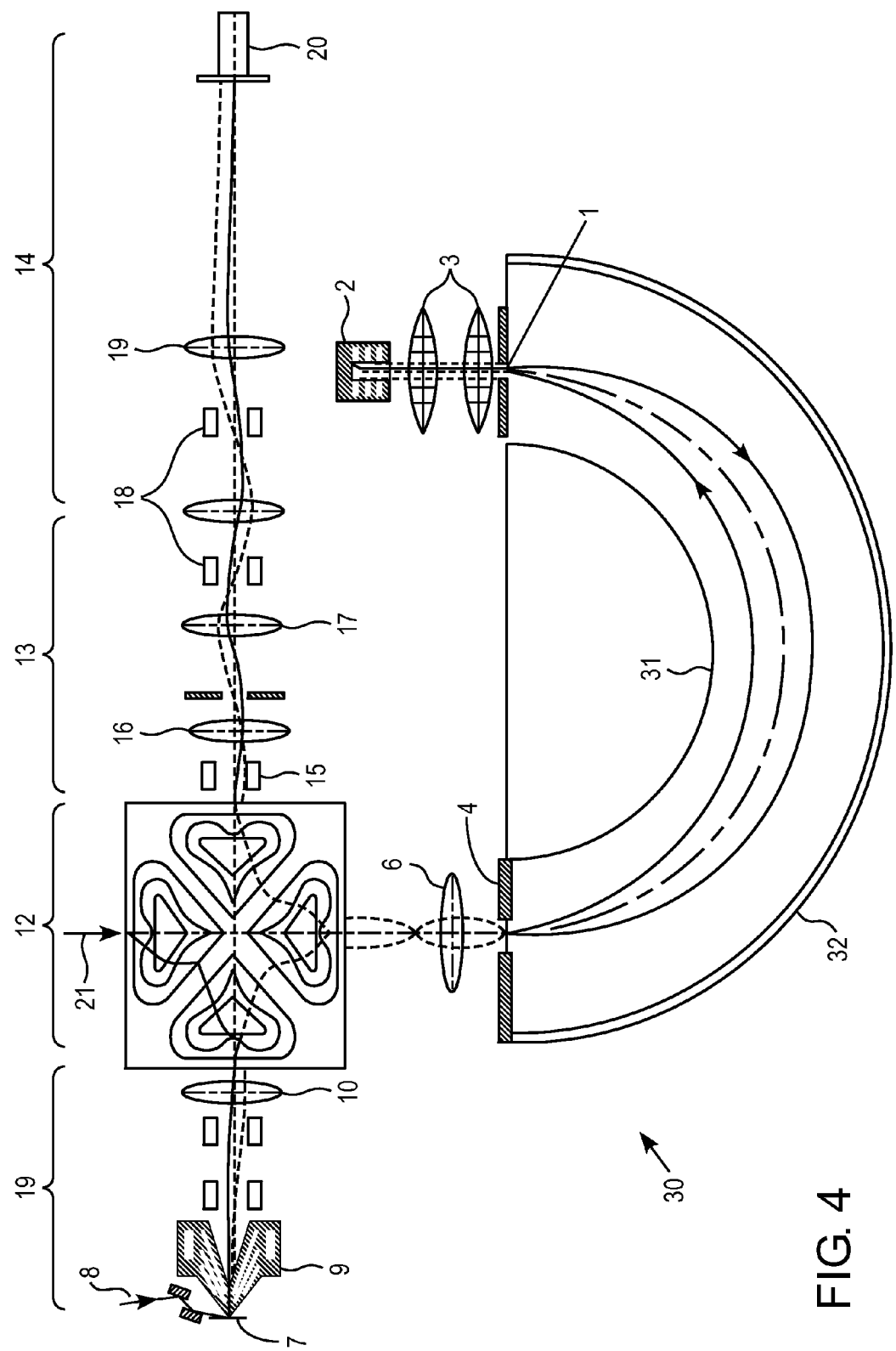
FIG. 4 shows a diagrammatic view of a spectroscope according to the invention.

FIG. 4 shows a spectroscope according to the invention. A sample 7 to be investigated is arranged in a sample holder. The sample can be irradiated with X-ray radiation 8. Alternatively or in combination therewith electrons 21 can also be applied from an electron gun to the sample. To apply the electrons 21 from the electron gun to the sample there is provided a magnetic diverter 5 which diverts the electrons 21 in such a way that they are imaged on the sample by means of the field lens 10 and the immersion lens 9. The X-rays 8 and/or the electrons 21 will interact with the surface of the sample 7 to be investigated and—depending on the respective potential set—are reflected there or release electrons.

The energy of the electrons and their irradiation direction or positional distribution permits conclusions to be drawn about properties of the sample. Therefore the released electrons are imaged into the magnetic field diverter 5 by means of the immersion lens 9 and the field lens 10. The magnetic field diverter 5 deflects the electrons in such a way that they are imaged by means of the lens 6 on the entrance plane 4 of the energy analyser 30 which here is a hemispherical analyser comprising an inner hemisphere 31 and an outer hemisphere 32.

The choice of the potential difference between the inner hemisphere 31 and the outer hemisphere 32 as well as the width of the exit slot 1 of the energy analyser determines what energy those electrons have which issue from the exit slot 1. Those electrons are imaged by way of the transfer lens device 3 on to the mirror element 2 which reflects the electrons so that they are imaged back on to the exit slot 1 by way of the transfer lens device 3. The reflected electrons then pass through the hemispherical analyser 30 again and issue from the energy analyser by way of the entrance surface 4. They are then focused again by the lens 6 into the magnetic field diverter which passes the issuing electrons into an optical transfer arrangement 13 comprising a deflector 15, transfer lenses 16 and intermediate lenses 17.

The electrons are then imaged by way of the deflector 18 and the projector lens 19 on to a detector 20 which here is a CCD detector.

The spectroscope thus comprises the objective lenses 19, the magnetic field diverter 12, the optical transfer arrangement 13, the projection/detection device 14 and the energy analyser 30.

In FIG. 4 the dispersive plane of the energy analyser 30 is in the plane of the paper, in which a notional line between the sample 7 and the detector 20 is also disposed. It is desirable however if the dispersive plane is perpendicular to the plane of the paper as then there is a greater degree of freedom in regard to dimensioning and positioning of the individual components, because of the spatial separation of the projection/detection device 14 and the mirror element 2.

LIST OF REFERENCES 1 exit slot
2 mirror element
3 transfer lens device
4 entrance surface
5 magnetic field diverter
6 lens
7 sample
8 X-ray radiation
9 immersion lens
10 field lens
12 magnetic field diverter
13 optical transfer arrangement
14 projection/detection device
15 deflector
16 transfer lenses
17 intermediate lenses
18 deflector
19 projector lens
20 detector
21 electrons
30 energy analyser
31 inner hemisphere
32 outer hemisphere

The invention claimed is:

1. An imaging energy filter for electrically charged particles with a toroidal energy analyser with an entrance plane and an exit plane, wherein a mirror element is provided for electrically charged particles and is so arranged that charged particles which leave the toroidal energy analyser by way of the exit plane are reflected back into the toroidal energy analyser by the mirror element so that the charged particles pass through the toroidal energy analyser a further time in the opposite travel direction.

2. An energy filter as set forth in claim 1 wherein a transfer lens device is arranged between the exit plane and the mirror element, wherein the transfer lens device preferably has a linear magnification $V_L = ZB_2/ZB_1 < 0$.

3. An energy filter as set forth in claim 2 wherein the transfer lens device has at least two lens elements for electrically charged particles.

4. An energy filter as set forth in claim 1 wherein the mirror element is an electrostatic mirror.

5. An energy filter as set forth in claim 2 wherein the mirror element and the transfer lens device are so matched to each other that the chromatic aberration and/or the spherical aberration of the transfer lens device is reduced by the mirror element.

6. An energy filter as set forth in claim 1 wherein there is provided a magnetic diverter having an entrance surface for charged particles, an energy filter surface and an exit surface for energy-filtered charged particles which is so arranged that charged particles which are incident on the entrance surface of the magnetic diverter at an angle of incidence α which is less than 20° are diverted by the magnetic diverter so that they issue from the energy filter surface of the magnetic diverter at an exit angle β which is less than 20° and are incident on the entrance surface of the toroidal energy analyser at an entrance angle γ which is less than 20°,
wherein charged particles which issue from the entrance surface of the toroidal analyser at an exit angle δ are incident on the energy filter surface of the magnetic diverter at an entrance angle ε which is less than 20° and are diverted by the magnetic diverter so that they leave the exit surface of the magnetic diverter at an exit angle ζ which is less than 20°, and
wherein an immersion lens is provided between the magnetic diverter and the toroidal analyser.

7. A spectroscope for charged particles comprising an energy filter as set forth in claim 1 wherein the spectroscope is preferably an electron spectroscope.

8. A spectroscope as set forth in claim 7 wherein there is provided a detector for detecting the charged particles issuing by way of the entrance surface of the toroidal analyser.

9. A spectroscope as set forth in claim 8 wherein there is provided an energy filter for electrically charged particles with a toroidal energy analyser with an entrance plane and an exit plane, wherein a mirror element is provided for electrically charged particles and is so arranged that charged particles which leave the toroidal energy analyser by way of the exit plane are reflected back into the toroidal energy analyser by the mirror element so that the charged particles pass through the toroidal energy analyser a further time in the opposite travel direction,
wherein there is provided a magnetic diverter having an entrance surface for charged particles, an energy filter surface and an exit surface for energy-filtered charged particles which is so arranged that charged particles which are incident on the entrance surface of the magnetic diverter at an angle of incidence α which is less than 20° are diverted by the magnetic diverter so that they issue from the energy filter surface of the magnetic diverter at an exit angle β which is less than 20° and are incident on the entrance surface of the toroidal energy analyser at an entrance angle γ which is less than 20°,
wherein charged particles which issue from the entrance surface of the toroidal analyser at an exit angle δ are incident on the energy filter surface of the magnetic diverter at an entrance angle ε which is less than 20° and are diverted by the magnetic diverter so that they leave the exit surface of the magnetic diverter at an exit angle ζ which is less than 20°,
wherein an immersion lens is provided between the magnetic diverter and the toroidal analyser, and wherein the detector detects the charged particles issuing by way of the exit surface of the magnetic diverter.

10. A spectroscope as set forth in claim 7 wherein there is provided a sample receiving means so arranged that charged particles emitted by a sample arranged on the sample receiving means, possibly after passing through an optical imaging system at an angle of incidence γ which is less than 20° are incident on the entrance surface of the toroidal energy analyser.

11. A spectroscope as set forth in claim 10 wherein there is provided a radiation source for acting with radiation on a sample received on the sample receiving means.

12. A spectroscope as set forth in claim 11 having an energy filter as set forth in claim 6 wherein the magnetic diverter has a radiation entrance surface and the radiation source is so arranged that radiation is incident on the radiation entrance surface at an entrance angle β which is less than 10° and is diverted by the magnetic diverter in such a way that it issues from the entrance surface of the magnetic diverter at an exit angle θ which is less than 10° and is directed on to the sample receiving means.

13. A spectroscope as set forth in claim 10 wherein the dispersive plane of the toroidal analyser is arranged substantially perpendicularly to a notional line extending between the sample receiving means and the detector.

14. A spectroscope as set forth in claim 7 wherein it is an imaging ESCA electron spectroscope.

15. An energy filter as set forth in claim 2 wherein the linear magnification $V_L = ZB_2/ZB_1$ is between −0.9 and −1.1.

16. An energy filter as set forth in claim 15 wherein the linear magnification $V_L = ZB_2/ZB_1$ is −1.

17. An energy filter as set forth in claim 5 wherein the chromatic aberration and/or the spherical aberration of the transfer lens device is reduced by the mirror element by at least 30%.

18. An energy filter as set forth in claim 17 wherein the chromatic aberration and/or the spherical aberration of the transfer lens device is reduced by the mirror element by at least 60%.

19. A spectroscope as set forth in claim 8 wherein the detector is a CCD detector.

20. A spectroscope as set forth in claim 8 wherein the detector is a channel plate multiplier with fluorescent screen and downstream-disposed CCD detector.

21. A spectroscope as set forth in claim 7 wherein the imaging energy filter is provided with a magnetic diverter having an entrance surface for charged particles, an energy filter surface and an exit surface for energy-filtered charged particles which is so arranged that charged particles which are incident on the entrance surface of the magnetic diverter at an angle of incidence α which is less than 20° are diverted by the magnetic diverter so that they issue from the energy filter surface of the magnetic diverter at an exit angle β which is less than 20° and are incident on the entrance surface of the toroidal energy analyser at an entrance angle γ which is less than 20°, wherein charged particles which issue from the entrance surface of the toroidal analyser at an exit angle δ are incident on the energy filter surface of the magnetic diverter at an entrance angle ε which is less than 20° and are diverted by the magnetic diverter so that they leave the exit surface of the magnetic diverter at an exit angle ζ which is less than 20°, wherein an immersion lens is provided between the magnetic diverter and the toroidal analyser, and wherein there is provided a sample receiving means so arranged that charged particles emitted by a sample arranged on the sample receiving means are incident on the entrance surface of the magnetic diverter at an angle of incidence α which is less than 20°.

22. An energy filter as set forth in claim 1 wherein the toroidal energy analyser is a hemispherical analyser.

* * * * *